United States Patent [19]

Misu

[11] Patent Number: 4,990,984
[45] Date of Patent: Feb. 5, 1991

[54] SEMICONDUCTOR DEVICE HAVING PROTECTIVE ELEMENT

[75] Inventor: Kazuhiro Misu, Tokyo, Japan

[73] Assignee: NEC Corporation, Tokyo, Japan

[21] Appl. No.: 276,582

[22] Filed: Nov. 28, 1988

[30] Foreign Application Priority Data

Nov. 27, 1987 [JP] Japan .................. 62-300606

[51] Int. Cl.⁵ .................................. H01L 29/78
[52] U.S. Cl. ................. 357/23.13; 357/23.1; 357/23.11; 357/54
[58] Field of Search ........... 357/23.13, 54, 23.11, 357/23.12, 23.1, 41

[56] References Cited

U.S. PATENT DOCUMENTS

| 4,603,059 | 7/1986 | Kiyosumi et al. | 357/54 |
| 4,668,970 | 5/1987 | Yatsuda et al. | 357/23.5 |
| 4,672,409 | 6/1987 | Takei et al. | 357/54 |
| 4,727,405 | 2/1988 | Misu | 357/23.13 |

FOREIGN PATENT DOCUMENTS

| 0316211 | 5/1989 | European Pat. Off. | 357/23.13 |
| 0138953 | 10/1981 | Japan | 357/23.13 |
| 0155536 | 12/1981 | Japan | 357/54 N |
| 0045975 | 3/1982 | Japan | 357/23.13 |
| 0052866 | 3/1984 | Japan | 357/23.13 |
| 63-55975 | 3/1988 | Japan | 357/23.14 |
| 1194436 | 8/1989 | Japan | 357/23.11 |

OTHER PUBLICATIONS

Lin et al., "A CMOS VLSI ESD Input Protection Device", EOS/ESD, Oct. 1984.
"Protection of MOS Integrated Circuits from Destruction by Electrostatic Discharge", J. K. Keller Electrical Overstress/Electrostatic Discharge Symposium Proceedings, Rome Air Development Center (1980), pp. 73-80.

Primary Examiner—Rolf Hille
Assistant Examiner—Minh Loan Tran
Attorney, Agent, or Firm—Helfgott & Karas

[57] ABSTRACT

A semiconductor device having a protective transistor for protecting an internal circuit from an excess voltage applied to an input terminal is disclosed. The protective transistor includes first and second channel regions coupled in series each other and formed between source and drain regions. A portion of a field insulating layer is provided on the first channel region as a gate insulating film, and the drain region is separated from the portion of the field insulating layer by the second channel region.

8 Claims, 5 Drawing Sheets

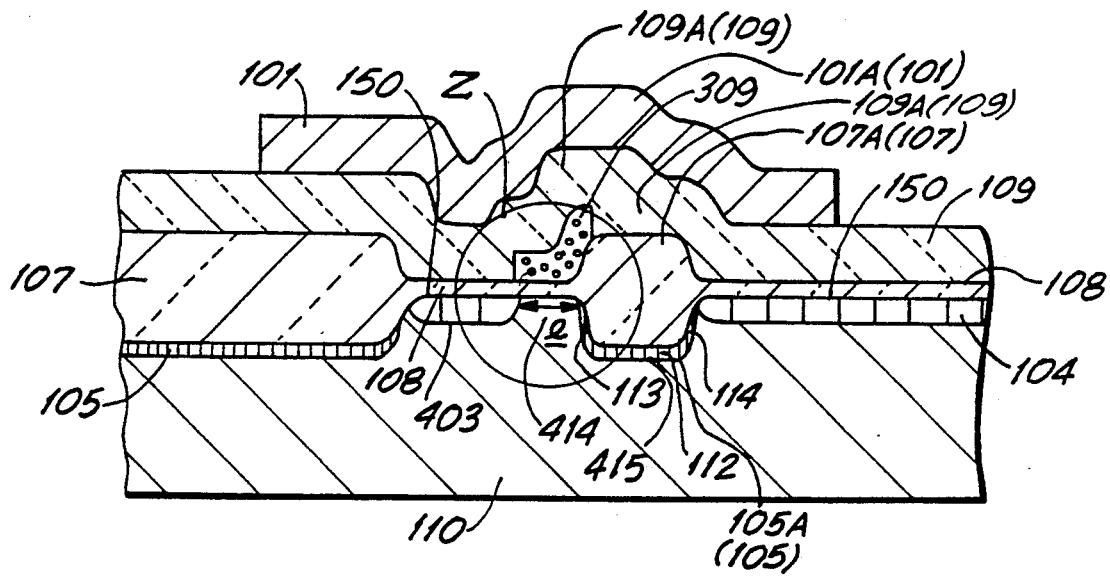
FIG.7   IGFET $Q_{11}$
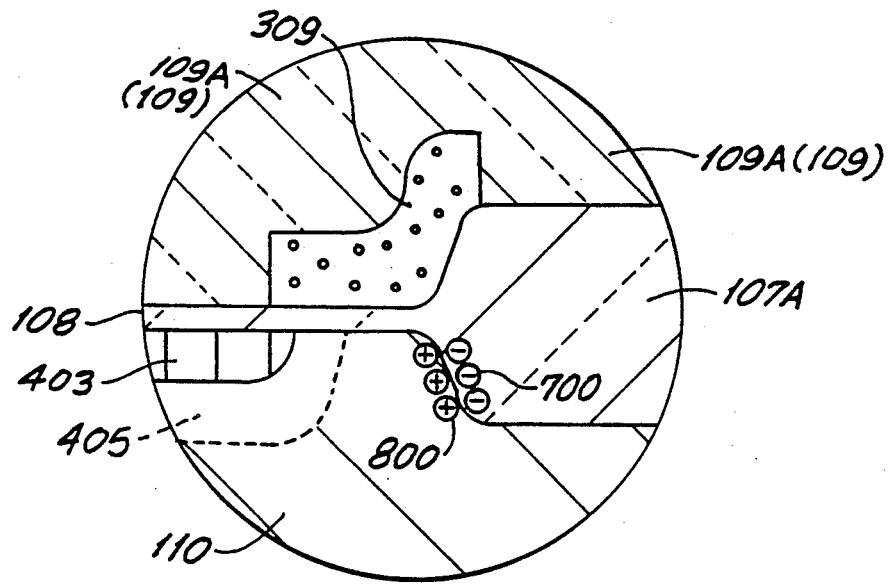
FIG.8
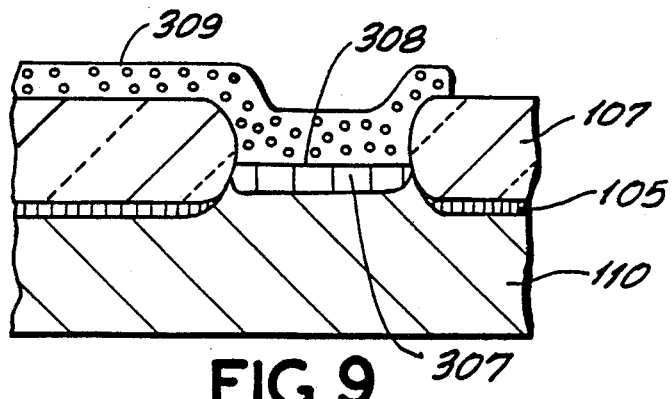
FIG.9

SEMICONDUCTOR DEVICE HAVING PROTECTIVE ELEMENT

BACKGROUND OF THE INVENTION

The present invention relates to a semiconductor device having a protective element between an input terminal and an internal circuit.

Recently, an insulate gate field effect transistor (hereinafter abbreviated to IGFET) in an internal circuit of a semiconductor device employs a very thin silicon oxide film such as of 200 to 300 Å thickness as its gate insulating film, and therefore, an effective protective circuit must be provided between the input terminal and the internal circuit for protecting the gate insulating film from external abnormal surge voltages such as noise voltages of high level and/or a large amount of electrostatic charges applied to the input terminal. The protective circuit and protective elements constituting the protective circuit was disclosed, for example, by Jack K. Keller, entitled "PROTECTION OF MOS INTEGRATED CIRCUITS FROM DESTRUCTION BY ELECTROSTATIC DISCHARGE" in "ELECTRICAL OVERSTRESS/ELECTROSTATIC DISCHARGE SYMPOSIUM PROCEEDINGS" SESSION 3, pp. 73 to 80, Reliability Analysis Center 1980.

FIG. 1 shows a protective circuit in which first and second resistors $R_1$ and $R_2$ are connected in series each other and provided between an input terminal P and a gate electrode of an IGFET $Q_3$ to be protected in an internal circuit. An IGFET $Q_1$ serving as a protective element is connected at its gate electrode to a first node $N_1$ between the input terminal P constituted by a bonding pad and the first resistor $R_1$, at its drain region to a second node $N_2$ between the first and second resistors $R_1$, $R_2$ and at its source region to a ground potential line, and an IGFET $Q_2$ serving as a protective element is connected at its gate electrode and source region to the ground potential line in common and at its drain region to a third node $N_3$ between the second resistor $R_2$ and the gate electrode of the IGFET $Q_3$ to be protected. The first and second resistor elements $R_1$, $R_2$ are formed in a semiconductor substrate as impurity diffusion regions of a conductivity type opposite to that of the substrate. For example, when the substrate is of P-type, the impurity diffusion regions as the resistor elements are of N-type. Therefore, the PN junction capacitance component is provided in addition to the resistance component, and a peak of the surge voltage can be decreased by the resistance and capacitance components in the resistor element. Further, the resistor elements $R_1$, $R_2$ have a function to limit a current flowing the IGFET's $Q_1$, $Q_2$ when they are in a conductive state. IGFET $Q_2$ has the same thin gate insulating film as that of the IGFET $Q_3$ to be protected, and when the excess surge voltage appears at the node $N_3$ and be applied between the source and drain regions, the IGFET $Q_2$ conducts a punch-through phenomenon between source and drain regions thereof so that the surge voltage at the node $N_3$ is depressed to the earth potential and the gate insulating film of the IGFET $Q_3$ is protected. On the other hand, as the gate electrode of the IGFET $Q_1$ is connected to the node $N_1$, that is, to the input terminal, the severest state of the surge voltage influences directly on the gate insulating film of the IGFET $Q_1$. Therefore, the IGFET $Q_1$ employs a thick field insulating layer or the thick field insulating layer and an inter-ply insulating layer thereon as the gate insulating film so that the IGFET $Q_1$ per se is not destroyed by the surge voltage. The threshold voltage of the IGFET $Q_1$ becomes a high level such as 20 to 30 volts because of the thick gate insulating film, and when a high surge voltage of 20 to 30 volts or more is applied to the input terminal P, the IGFET $Q_1$ turns to a conductive state to depress the surge voltage at the node $N_2$ to the earth potential. The present invention concerns the structure of the IGFET $Q_1$.

When a high surge voltage of 20 to 30 volts or more is applied to the input terminal, an N-type inversion layer is induced under the thick gate insulating film, that is, at the channel region of the IGFET $Q_1$, and electrons flow from the N-type source region to the N-type drain region through the inversion layer. In this case, many electrons run by repeating collisions with silicon atoms in the inversion layer. Therefore, their energy becomes a low level, and the low energy electrons are drawn to the drain region. However, some lucky electrons run without the collisions or with a small number of times of collisions, and keep a high energy. The lucky electrons (hot electrons) have a high energy sufficient to get over the barrier of a silicon oxide, and therefore, they are introduced into a part near the drain region of a side wall of the field insulating layer made of silicon oxide as the gate insulating film, and trapped therein.

In a prior art, the drain region of the IGFET $Q_1$ is attached to an upper part of the side wall of the embedded field insulating layer as the gate insulating film, and the lucky electrons (hot electrons) are trapped in a lower part under the upper part of the side wall. The trapped electrons induce positive charges in the substrate in the vicinity of the trapping part (lower part) of the side wall, and therefore, in the prior art, the induced positive charges are positioned near the drain region and the breakdown voltage of the drain region becomes a low level by the induced positive charges. Consequently, when an normal voltage, that is, an operating voltage is applied to the input line through the input terminal to operate the internal circuit (the internal circuit is an inherent circuit of the semiconductor device, and operates and conducts the functions of the device by the operating voltage), an unfavorable leakage current is flown from the drain region of the protective IGFET $Q_1$ to the substrate because of the low breakdown voltage nature. Therefore, a high reliable semiconductor device cannot be obtained.

SUMMARY OF THE INVENTION

Accordingly, an object of the present invention is to provide a semiconductor device having a protective IGFET in which the electrons trapped in the end portion of the gate insulating film facing to the drain region do not affect the breakdown voltage of the drain region thereby eliminating the leakage current problem and realizing a high reliable semiconductor device.

According to the present invention, there is provided a semiconductor device having a protective transistor for protecting an internal circuit (inherent circuit of the device to operate the functions of the device) from an excess voltage applied to an input terminal, the transistor comprising; a source region formed in a major surface of a semiconductor substrate of a first conductivity type and having a second conductivity type opposite to the first conductivity type, the source region being connected to an earth potential line; a drain region formed in the major surface of the semiconductor substrate and having the second conductivity type, the drain region being connected to the input terminal through a protective resistor element; a first channel region abutted against the source region; a second channel region provided between the first channel region and the drain region and abutted against the first channel region and against the drain region; a thick insulating layer formed on the first channel region, the thick insulating layer having a bottom depressed from the major surface in which the source and drain regions are formed such that the first channel region under the bottom is depressed from the major surface, a first side wall facing to the source region and a second side wall facing to the second channel region; an insulating film having a thickness thinner than the thick insulating layer and formed on the second channel region; a polycrystalline silicon electrode formed on the insulating film above the second channel region, the silicon electrode being connected to the substrate through an island-like shape impurity region of the second conductivity type formed in the substrate such that the silicon electrode maintains a floating state; an inter-ply insulating layer covering the silicon electrode above the second channel region and covering the thick insulating layer above the first channel region; and a gate electrode connected to the input terminal and formed on the inter-ply insulating layer above the first and second channel regions.

BRIEF DESCRIPTION OF THE DRAWINGS

FIG. 7 is a cross-sectional view taken along line D—D' in FIG. 6 as viewed in the direction of arrows;

FIG. 8 is an enlarged cross-sectional view of a part encircled by a solid circle line Z in FIG. 7, and showing phenomenon in a normal operating condition at the embodiment of present invention; and FIG. 9 is an enlarged cross-sectional view taken along line E—E' in FIG. 5 as viewed in the direction of arrows.

DESCRIPTION OF A PRIOR ART

Figure 1:
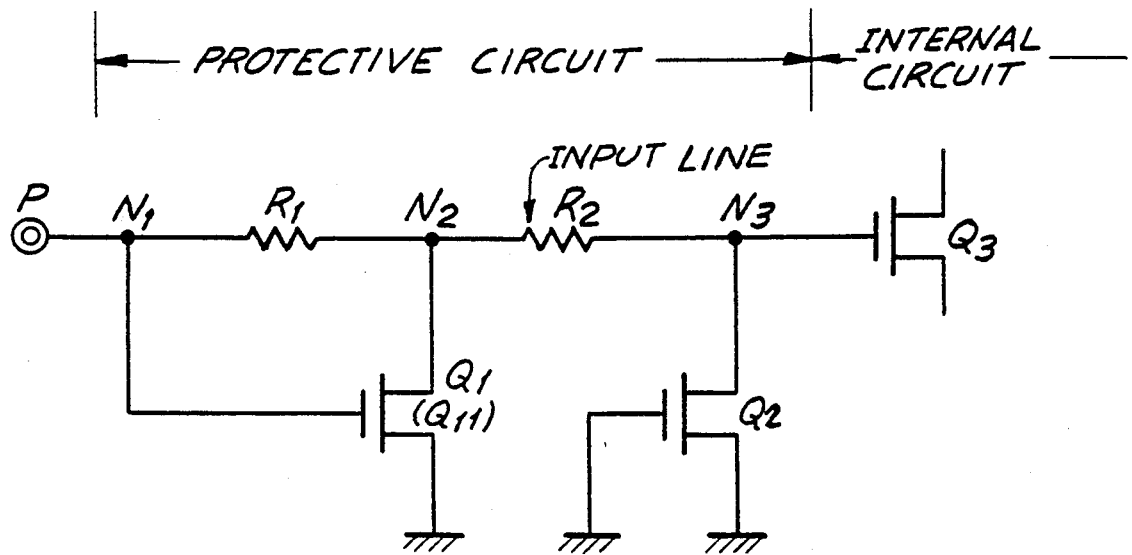
FIG. 1 is a circuit diagram showing a protective circuit.
Figure 2:
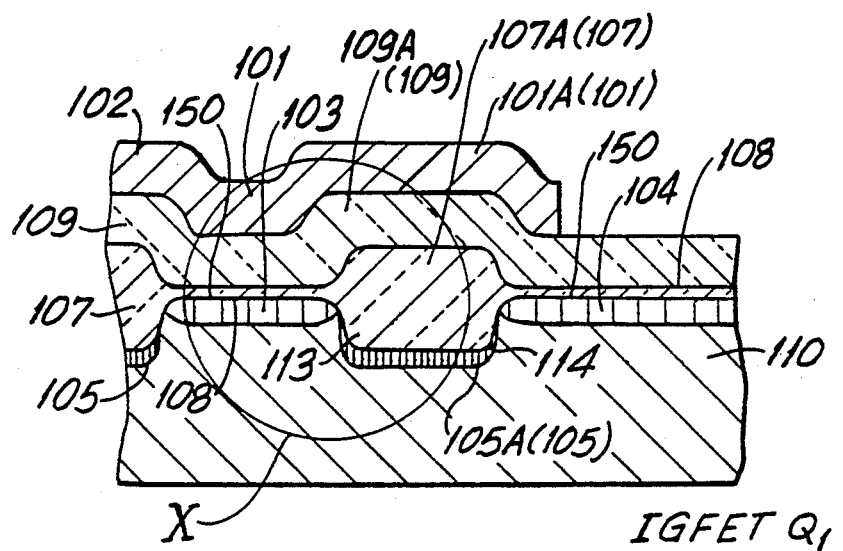
FIG. 2 is a cross-sectional view showing a protective IGFET in a prior art.

Referring to FIG. 2, an IGFET $Q_1$ as a protective element in a prior art is disclosed. In a P-type silicon substrate 110, a field silicon oxide layer 107 partially embedded in the substrate and having the thickness of 6,000 Å is selectively formed, and a thin silicon oxide film 108 of 300 Å thickness is formed on a flat major surface 150 of the substrate with a gate insulating films of IGFET's $Q_2$, $Q_3$ (FIG. 1). An inter-ply silicon oxide layer 109 of 10,000 Å thickness is entirely formed, and $P^+$-type channel stopper region 105 is provided under the field silicon oxide layer 107. A portion 107A of the field silicon oxide layer 107 and a portion 109A of the inter-ply silicon oxide layer 109 on the portion 107A are used as the gate insulating film of the IGFET $Q_1$. An N-type source region 104 and an N-type drain region 103 of the IGFET $Q_1$ are formed in the major surface 150 of the substrate 110 and attached to an upper part of one side wall 114 and an upper part of the other side wall 113 of the portion 107A of the embedded silicon oxide layer 107, respectively. An aluminum layer 101 is formed on the inter-ply insulating layer 109 to constitute a bonding pad 102 and a gate electrode 101A of the IGFET $Q_1$ on the gate insulating film consisting of portions 107A, 109A of the insulating layers 107, 109. The drain region 103 is connected to the node $N_2$ in the input line, and the source region 104 is connected to the earth potential line (FIG. 1); the bonding pad 102 is the input terminal P and the node $N_1$ (FIG. 1).

Figure 3:
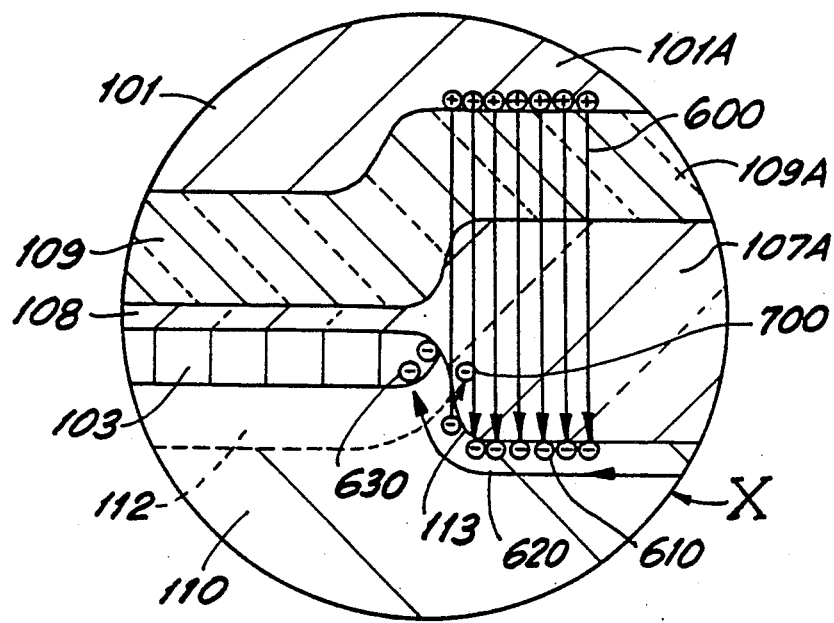
FIGS. 3 and 4 are enlarged cross-sectional views of a part encircled by a solid circle line X in FIG. 2, and showing phenomena at a boundary between the drain region and the thick gate insulating film.

Referring to FIG. 3, when an excess positive abnormal voltage over the threshold voltage of the IGFET $Q_1$ is applied to the gate electrode 101A through the bonding pad (input terminal), an N-type inversion layer (not shown in the drawing) is induced along the bottom of the thick gate insulating film 107A by the electric field 600, and electrons 610 flow in the inversion layer from the source region to the drain region as indicated by an arrow 620. Many electrons 630 decrease their energy by repeating collisions with silicon atoms in the inversion layer, and reach to the drain region 103. However, some electrons 700 run in the inversion layer without collisions, and keep a high energy. There electrons (hot electrons) 700 having a high energy are introduced into a lower part of the side wall 113 of the embedded gate insulating film 107A getting over the barrier of the silicon oxide. In FIG. 3, the numeral 112 denotes a depletion layer from the drain region when the excess surge voltage is applied.

Figure 4:
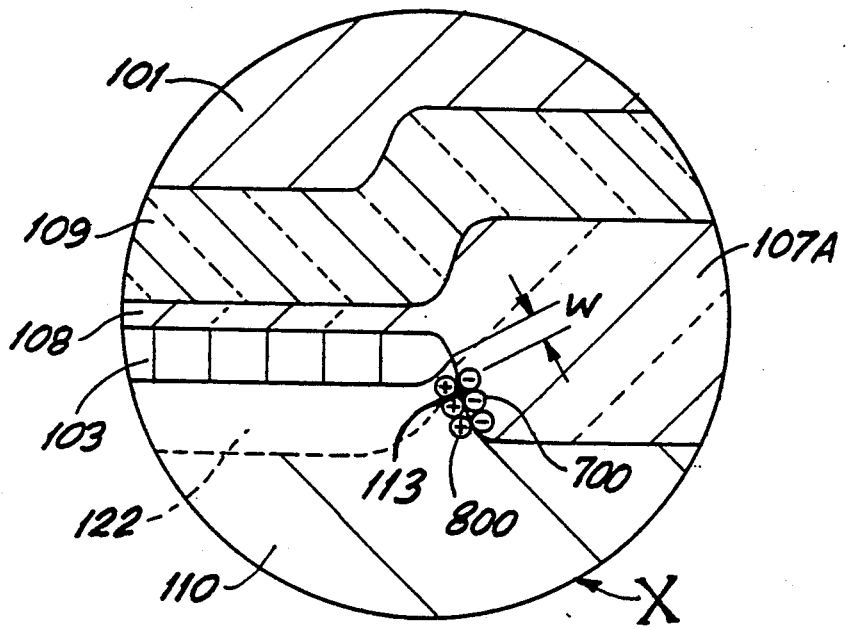

Referring to FIG. 4, the trapped electrons 700 induce positive charges 800 in the silicon substrate near the end of the drain which is attached to the upper part of the side wall 113. Therefore, a depletion layer 122 from the drain region 103 caused when an normal voltage, that is, an operation input voltage is applied to the bonding pad and to the input line cannot be largely extended at its end along the side wall 113 and has a narrow-width W. Consequently, the breakdown voltage of the drain region at the operating state becomes a low level, and an unfavorable leakage current by the low breakdown voltage nature flows from the drain region 103 to the substrate 110. In FIGS. 3 and 4, the channel stopper region 105A in FIG. 1 is omitted to draw.

DETAILED DESCRIPTION OF AN EMBODIMENT

A circuit diagram of the embodiment is the same as FIG. 1, but the protective IGFET $Q_1$ is replaced by an IGFET $Q_{11}$ of the present invention.

Figure 5:
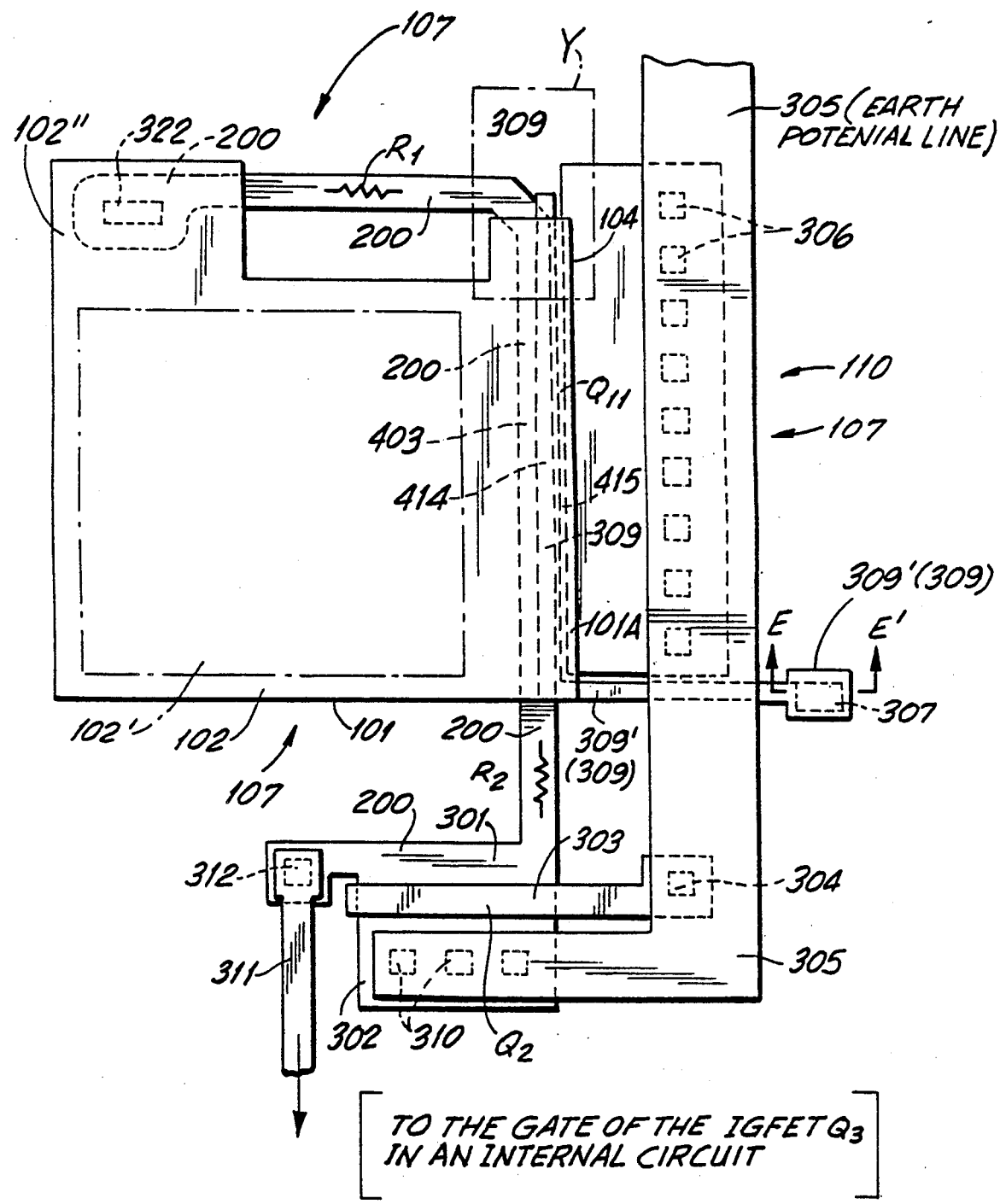
FIG. 5 is a plan view showing an embodiment of the present invention.

Referring to FIG. 5, an N-type impurity region 200 of stripe and bending plan shape, an N-type impurity region 104 of rectangular plan shape, an N-type impurity region 302 of rectangular plan shape and an N-type impurity region 307 of island-like plan shape are formed in a flat major surface of a P-type silicon substrate 110. The impurity region 200 includes an N-type diffused first resistor element $R_1$, an N-type drain region 403 of an IGFET $Q_{11}$, an N-type diffused second resistor element $R_2$ and an N-type drain region 301 of an IGFET $Q_2$. The impurity region 104 serves as an N-type source region of the IGFET $Q_{11}$, and the impurity region 302 serves as an N-type source region of the IGFET $Q_2$. In all portions of the P-type silicon substrate except the N-type impurity regions 200, 104, 302 and 307 and the channel regions between the source and drain regions of respective IGFET's $Q_{11}$, $Q_2$, a thick field silicon oxide layer 107 partially embedded in the substrate such that the bottom thereof is depressed from the flat major surface of the substrate is selectively formed. Therefore, these regions are substantially surrounded by the thick field silicon oxide layer. The IGFET $Q_{11}$, the IGFET $Q_2$ and the first and second resistor elements $R_1$, $R_2$ constitute a protective circuit. An aluminum layer 101 is formed on the thick field silicon oxide layer via an inter-ply silicon oxide layer. The aluminum layer 101 includes a bonding pad 102 as an input terminal of the semiconductor device, a gate electrode 101A of the protective IGFET $Q_{11}$ and a contact section 102''. The bonding pad 102 has an effective surface area 102' indicated by a phantom line where a passivation film is removed to contact with a thin wire, for example. The contact section 102' of the aluminum layer 101 is connected to at one end of the N-type impurity region 200 through a contact hole 322 provided in the inter-ply silicon oxide layer, and at the other end of the N-type impurity region 200, an aluminum wiring layer 311 is connected to the region 200 through a contact hole 312 provided in the inter-ply silicon oxide layer. The wiring layer 311 extends to an internal circuit section of the device (chip) and be connected to a silicon gate electrode of an IGFET $Q_3$ (FIG. 1) to be protected in the internal circuit. An aluminum earth potential line 305 is formed on the inter-ply silicon oxide layer and connected to the source region 302 of the IGFET $Q_2$ through a plurality of small contact holes 310 provided in the inter-ply silicon oxide layer and to the source region 104 of the IGFET $Q_{11}$ through a plurality of small contact holes 306 provided in the inter-ply silicon oxide layer. A polycrystalline silicon gate electrode 303 of the punch-through protective IGFET $Q_2$ doped with N-type impurities is formed on the channel region between the source and drain regions 302, 301 of the IGFET $Q_2$ via a thin gate insulating film having a thickness, for example, of 300 Å same as the gate insulating film of the IGFET $Q_3$ to be protected. The silicon gate electrode 303 is connected at its one end to the earth potential line 305 through a contact hole 304 provided in the inter-ply silicon oxide layer.

The channel region of the IGFET $Q_{11}$ consists of a first channel region 415 and a second channel region 414, and on the second channel region 414, a polycrystalline silicon electrode 309 doped with N-type impurities is formed via a thin silicon oxide film. The silicon electrode 309 is led out by its leading-out section 309', crossing under the earth potential line by interposing the inter-ply silicon oxide layer, and contacted directly to the surface 308 of the N-type impurity region 307 of island-like plan shape as shown in FIG. 9. The gate structure of the IGFET $Q_{11}$ has a broad channel width by the stripe-like plan shape of the drain region, first and second channel regions and a stripe like plan shape of the silicon electrode and the rectangular plan shape of the source region, and therefore, an effective protecting action can be realized. Further, the rectangular source region can be reliably connected to the earth potential line because of providing a plurality of contact holes arranged in one direction.

Figure 6:
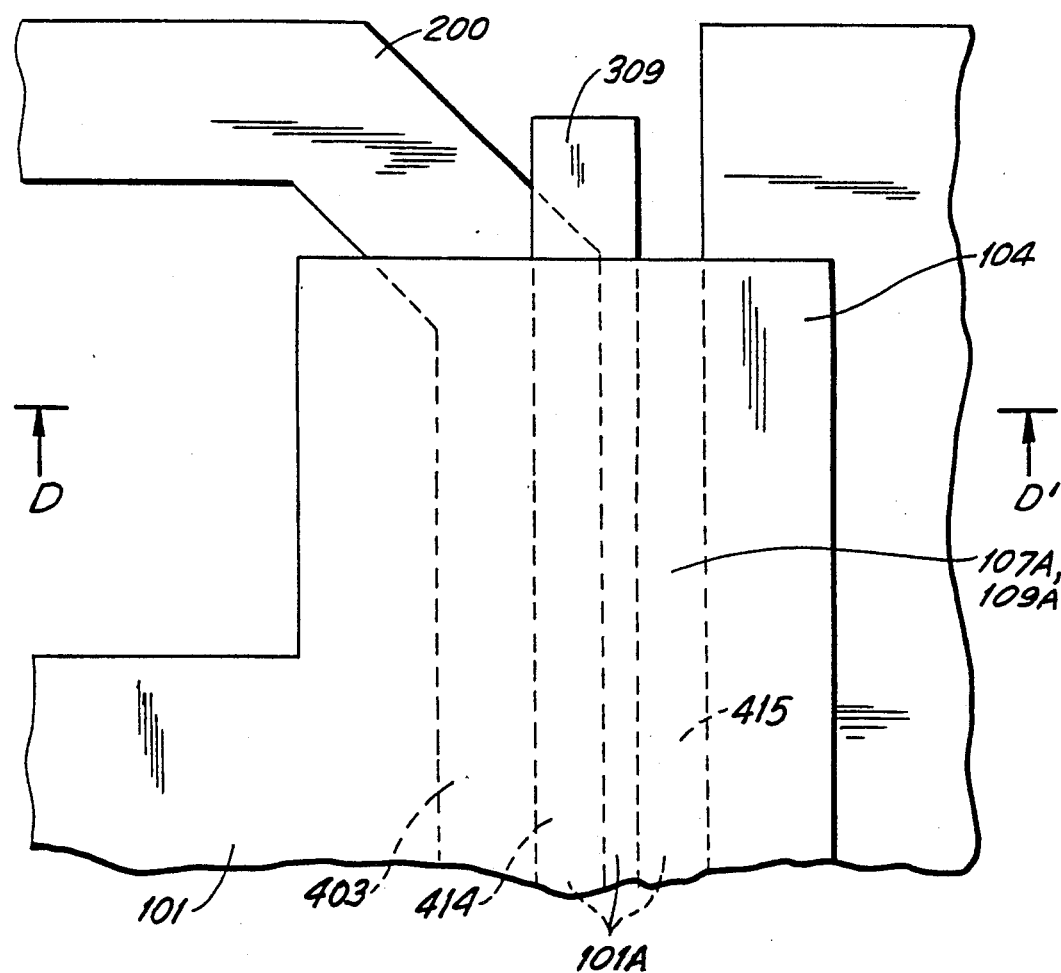
FIG. 6 is an enlarged plan view of a part encircled by a chain line Y in FIG. 5.

Referring to FIGS. 6 and 7, the structure of the protective IGFET $Q_{11}$ of the present invention will be detailedly explained.

The N-type source region 104 and the N-type drain region 403 are formed in the flat major surface 150 of the P-type silicon substrate 110. Between the source and drain regions, the channel region of the IGFET $Q_{11}$ is provided. The channel region consists of the first channel region 415 and the second channel region 414. On the first channel region 415, a portion 107A of a thick field silicon oxide layer 107 of 6000 Å thickness embedded partially in the substrate is formed. The portion 107A has a bottom 112 depressed from the flat major surface and first and second side walls 114, 113. Therefore, the first channel region 415 is formed along the first side wall 114, the bottom 112 and the second side wall 113. In the embodiment, a portion 105A of a P+-type channel stopper region 105 is provided at the first channel region. However, the P+-type portion 105A may be omitted to form. The inter-ply silicon oxide layer 109 of 10,000 Å thickness is formed as the prior structure of FIG. 2, and a portion 109A of to layer 109 and a portion 107A of the layer 107 constitute a gate insulating film on the first channel region. On the other hand, on the second channel region 414, a thin silicon oxide film 108 is formed on the major surface 150 of the substrate with the gate insulating films of other IGFET's $Q_2$, $Q_3$ (FIG. 1), and on the thin silicon oxide film 108, the silicon electrode 309 connected to the substrate 110 through the N-type impurity region 307 (FIGS. 5 and 9) is formed. The gate electrode 101A made of the aluminum layer 101 and connected to the bonding pad as the input terminal is formed above the first and second channel regions entirely. As shown in FIG. 7, the source region 104 is attached to the first side wall 114 of the embedded portion 107A of the field silicon oxide layer, but the drain region 403 is not attached to the second side wall 113 of the embedded portion 107A and separated by the second channel region 414. The length l of the second channel region 414 can be determined such that when an excess abnormal voltage at a level of the threshold voltage (20 to 30 volts) of the first channel region or more is applied, the depletion layer from the drain region 403 reaches to the second side wall 113 of the embedded portion 107A, and that when a normal operation voltage is applied, the depletion layer from the drain region 403 does not reach to the side wall 113 of the embedded portion 107A. The silicon electrode 309 is formed with the silicon gates of other IGFET's $Q_2$, $Q_3$, and the drain region 403 is formed by a self-alignment manner with the silicon electrode 309, that is, by introducing N-type impurities using the silicon electrode as a mask. Therefore, the desired length l of the second channel region 414 can be obtained. The structure of the silicon electrode 309 and the drain region 403 is favorable because they can be formed with the formation of the other IGFET's $Q_2$, $Q_3$. The silicon electrode 309 maintain a floating state, that is, any other wiring and/or electrode is not connected to. Therefore, the thin silicon oxide film on the second channel region is not destroyed when the excess voltage is applied to the input terminal. The silicon oxide film may has the same thickness of the gate insulating films of IGFET's $Q_2$, $Q_3$, for example, of 300 Å. However, if the thin silicon oxide film has a thickness, for example, of 500 to 1000 Å thicker than the gate insulating films of the IGFET's $Q_2$, $Q_3$, the security of the thin film against the excess voltage ca be further increased. Moreover, if the PN junction between the one end of the N-type impurity region 200 and the P-type substrate 110 under the contact hole 322 causes a breakdown by an excess voltage, the potential of the substrate is instantly increased by a substrate resistance and the substrate current flown instantly, and also the potential of the silicon electrode 309 is also instantly increased through the impurity region 307 (FIG. 5). In this case, the potential difference between the drain region and the silicon electrode is decreased, and the security of the thin film would be further expected.

When an excess abnormal positive voltage is applied to the bonding pad as the input terminal and to the input line, the N-type inversion layer (not shown in the drawing) is induced along the bottom 112 and first and second side walls 114, 113 of the portion 107A of the embedded field silicon oxide layer at the first channel region 415, and at the second channel region 414, an inversion layer is handly produced because the silicon electrode 309 which is connected to the P-type substrate 110 through the N-type impurity region 307 maintains so-called floating state and conducts a role of shielding. However, as mentioned above, the depletion layer from the drain region by the excess voltage reaches to the side wall 113 of the first channel region, and therefore, the IGFET $Q_{11}$ maintains a conductive state and conducts as a protective element. In this time, the same phenomenon as in the prior art structure is also produced. That is, hot electrons (lucky electrons) having a high energy are introduced into the side wall 113 of the embedded thick insulating layer and trapped therein, and positive charges 800 are induced in the substrate.

However, as shown in FIG. 8, when normal operating voltage is applied, the depletion layer 405 does not reach to the substrate portion where the positive charges 800 are induced, and an inversion layer is not produced on the second channel region 414 because of the shielding of the silicon electrode 309. Therefore, the depletion layer 405 never be suppressed its extension at the normal operating state, and the breakdown voltage is not reduced. In FIG. 8, the P+-type portion 105A of the channel stopper region 105 in FIG. 7 is omitted to draw.

Consequently, an unfavorable leakage current from the drain region to the substrate caused by the reduced breakdown voltage nature does not flow. Therefore, a reliable operation of the semiconductor device can be obtained.

What is claimed is:

1. A semiconductor device having a protective transistor for protecting an internal circuit from an excess voltage applied to an input terminal, said transistor comprising:

a source region formed in a major surface of a semiconductor substrate of a first conductivity type and having a second conductivity type opposite to said first conductivity type, said source region being connected to an earth potential line;

a drain region formed in said major surface of said semiconductor substrate and having said second conductivity type, said drain region being connected to said input terminal through a protective resistor element;

a first channel region abutted against said source region and having a value of a threshold voltage;

a second channel region provided between said first channel region and said drain region and abutted against said first channel region and against said drain region, said second channel region having a channel length between said first channel region and said drain region;

a thick insulating layer formed on said first channel region, said thick insulating layer having a bottom depressed from said major surface in which said source and drain regions are formed such that said first channel region under said bottom is depressed from said major surface, a first side wall facing said source region and a second side wall facing said second channel region;

an insulating film having a thickness less than that of said thick insulating layer and formed on said second channel region;

an impurity region of said second conductivity type having an island-like configuration and formed in said substrate of said first conductivity type;

a polycrystalline silicon electrode formed on said insulating film above said second channel region, said silicon electrode being connected to said impurity region so as to connect said silicon electrode to said substrate through an PN junction between said impurity region and said substrate and to maintain said silicon electrode in a floating state;

an inter-ply insulating layer covering said silicon electrode above said second channel region and covering said thick insulating layer above said first channel region; and a gate electrode connected to said input terminal and formed on said inter-ply insulating layer above said first and second channel region, said channel length of said second channel region being such that when an abnormal excess voltage at a level equal to or more than said value of said threshold voltage of said first channel region is through said input terminal, a depletion layer from said drain region reaches to said second side wall of said thick insulating layer facing said second channel region, and when a normal operation voltage is applied to said gate electrode, a depletion layer from said drain region is absent at said second side wall.

2. A semiconductor device of claim 1, in which said input terminal is a bonding pad, and said gate electrode and said bonding pad are continuously formed.

3. A semiconductor device of claim 1, in which said resistor element is an impurity region of said second conductivity type formed in said substrate.

4. A semiconductor device of claim 3, in which said resistor element and said drain region are continuously formed.

5. A semiconductor device of claim 1 further comprising a channel stopper region of said first conductivity type having a higher impurity concentration than said substrate, said channel stopper region being formed in said first channel region under said bottom of said thick insulating layer.

6. A semiconductor device of claim 1, in which said thick insulating layer is a portion of a field insulating layer selectively formed on said substrate.

7. A semiconductor device of claim 1, in which each of said drain region, said first and second channel regions and said silicon electrode has a stripe-like plan shape extending in one direction, and said source region has a rectangular plan shape extending in said one direction.

8. A semiconductor device of claim 7, in which said source region is connected to said earth potential line through a plurality of contact holes arranged in said one direction and formed in said inter-ply insulating layer.

* * * * *